US011914930B1

(12) United States Patent
Gokulakrishnan et al.

(10) Patent No.: US 11,914,930 B1
(45) Date of Patent: Feb. 27, 2024

(54) COMPUTATIONALLY EFFICIENT REDUCED KINETICS METHODOLOGIES FOR JET FUELS

(71) Applicant: COMBUSTION SCIENCE & ENGINEERING, INC., Columbia, MD (US)

(72) Inventors: Ponnuthurai Gokulakrishnan, Columbia, MD (US); Darin Viehe, Frederick, MD (US); Andrew Trettel, Jefferson, MD (US); Michael S. Klassen, Columbia, MD (US)

(73) Assignee: COMBUSTION SCIENCE & ENGINEERING, INC., Columbia, MD (US)

( * ) Notice: Subject to any disclaimer, the term of this patent is extended or adjusted under 35 U.S.C. 154(b) by 1432 days.

(21) Appl. No.: 14/024,422

(22) Filed: Sep. 11, 2013

Related U.S. Application Data

(60) Provisional application No. 61/700,093, filed on Sep. 12, 2012.

(51) Int. Cl.
*G06F 30/20* (2020.01)
*G06F 17/10* (2006.01)

(52) U.S. Cl.
CPC ............ *G06F 30/20* (2020.01); *G06F 17/10* (2013.01)

(58) Field of Classification Search
None
See application file for complete search history.

(56) References Cited

U.S. PATENT DOCUMENTS

| 5,446,870 | A  | * | 8/1995 | Hinsberg, III | G06F 30/20 703/6 |
| 6,013,172 | A  | * | 1/2000 | Chang | B01J 19/0006 208/113 |
| 8,000,943 | B2 | * | 8/2011 | Hix | G06F 30/23 703/2 |
| 2004/0159366 | A1 | * | 8/2004 | Tsangaris | F23G 5/027 141/59 |
| 2008/0153169 | A1 | * | 6/2008 | Hirata | G05D 11/138 422/68.1 |
| 2010/0049369 | A1 | * | 2/2010 | Lou | G05B 13/041 700/274 |

(Continued)

OTHER PUBLICATIONS

Development of an Experimental Database and Kinetic Models for Surrogate Diesel Fuels by J.T. Farrell et al.; 2007 SAE International, pp. 1-27.*

(Continued)

*Primary Examiner* — Akash Saxena
(74) *Attorney, Agent, or Firm* — DLA PIPER LLP (US)

(57) ABSTRACT

A method for implementing a modeling tool that generates optimized reduced kinetics models for given operating conditions and a numerical scheme to speed-up kinetics evaluation of turbulent-chemistry coupling during CFD simulations. The tool is capable of predicting ignition and flameholding phenomenon for most propulsion systems, including gas turbine applications. A lumped-parameterization based optimization scheme may generate multi-step quasi-global kinetics models using laminar flame speed as the target data. This scheme may be further extended to include optimization of emission predictions such as CO and $NO_x$.

14 Claims, 11 Drawing Sheets

(56) References Cited

U.S. PATENT DOCUMENTS

| | | | | |
|---|---|---|---|---|
| 2010/0332200 | A1* | 12/2010 | Chou | G06F 30/20 703/2 |
| 2011/0060563 | A1* | 3/2011 | Guenther | G16C 20/10 703/2 |
| 2011/0270505 | A1* | 11/2011 | Chaturvedi | F02D 41/1498 701/102 |
| 2018/0032704 | A1* | 2/2018 | Hirai | G16C 10/00 |
| 2018/0113963 | A1* | 4/2018 | Kordon | G06F 30/20 |
| 2021/0262658 | A1* | 8/2021 | Chen | G06F 30/25 |
| 2023/0194099 | A1* | 6/2023 | Zambon | G06F 30/17 703/7 |

OTHER PUBLICATIONS

"Computationally efficient implementation of combustion chemistry using in situ adaptive tabulation" by S B Pope. (provided by applicant on PTO 1449.*
Optimization of Reduced Kinetic Models for Reactive Flow Simulations P. Gokulakrishnan, R. Joklik, D. Viehe, A. Trettel, E. Gonzalez-Juez and M. Klassen Jun. 3-7, 2013, Proceedings of ASME Turbo Expo 2013 pp. 1-15.*
"Genetic algorithms for optimisation of chemical kinetics reaction mechanisms" by L. Elliott et al.(Progress in Energy and Combustion Science 30 (2004) 297-328).*
Wikipedia Definition of "Rate Equation" for a chemical reaction (Wikipedia Dec. 14, 2011 archive retrieval https://en.wikipedia.org/w/index.php?title=Rate_equation&oldid=465909244 ; pp. 12) (Year: 2011).*
Jeffery A. Lovett et al., "Development Needs for Advanced Afterburner Designs", 40th AIAA/ASME/SAE/ASEE Joint Propulsion Conference and Exhibit, Fort Lauderdale, FL, AIAA 2004-4192, pp. 1-12, Jul. 11-14, 2004.
Houshang B. Ebrahimi, "Overview of Gas Turbine Augmentor Design, Operation, and Combustion Oscillation", 42nd AIAA/ASME/SAE/ASEE Joint Propulsion Conference and Exhibit, Technical Papers, vol. 7, AIAA 2006-4916, pp. 5658-5673, Jul. 9-12, 2006.
P. Gokulakrishnan et al., "Experimental and Kinetic Modeling of Kerosene-Type Fuels at Gas Turbine Operating Conditions", Journal of Engineering for Gas Turbines and Power, vol. 129, pp. 655-663, Jul. 2007.
P. Gokulakrishnan et al., "Autoignition of Aviation Fuels: Experimental and Modeling Study", 43rd AIAA/ASME/SAE/ASEE Joint Propulsion Conference & Exhibit, Cincinnati, OH, AIA 2007-5701, pp. 1-12, Jul. 8-11, 2007.
P. Gokulakrishnan et al., "Ignition Characteristics of a Fischer-Tropsch Synthetic Jet Fuel", Proceedings of ASME Turbo Expo 2008: Power for Land, Sea and Air, Berlin, Germany, GT2008-51211, pp. 1-9, Jun. 9-13, 2008.
P. Gokulakrishnan, "Influence of Turbulence-Chemistry Interaction in Blow-out Predictions of Bluff-Body Stabilized Flames", 47th AIAA Aerospace Sciences Meeting Including the New horizons Forum and Aerospace Exposition, Orlando, FL, AIAA 2009-1179, pp. 1-17, Jan. 5, 2009.

Barry Kiel et al., "A Detailed Investigation of Bluff Body Stabilized Flames", 45th AIAA Aerospace Sciences Meeting and Exhibit, Reno, NV, AIAA 2007-168, Jan. 8-11, 2007 (10 pages).
Ponnuthurai Gokulakrishnan et al., "LES-PDF Modeling of Flame Instability and Blow-out in Bluff-Body Stabilized Flames", 45th AIAA/ASME/SAE/ASEE Joint Propulsion Conference and Exhibit, Denver, CO, AIAA 2009-5409, pp. 1-13, Aug. 2-5, 2009.
S.B. Pope, "Computationally Efficient Implementation of Combustion Chemistry Using In Situ Adaptive Tabulation", Combust. Theory Modeling, vol. 1, pp. 41-63 (1997).
Xiaolong Gou et al., "A Dynamic Multi-Timescale Method for Combustion Modeling with Detailed and Reduced Chemical Kinetic Mechanisms", Combustion and Flame, vol. 157, pp. 1111-1121 (2010).
Qing Tang et al., "Implementation of Combustion Chemistry In Situ Adaptive Chemistry Tabulation of Rate-Controlled-Constrained Equilibrium Manifolds", Proceedings of the Combustion Institute, vol. 29, pp. 1411-1417 (2002).
Wenting Sun et al., "A Path Flux Analysis Method for the Reduction of Detailed Chemical Kinetic Mechanisms", Combustion and Flame, vol. 157, pp. 1298-1307 (2010).
S. James et al., "Large-Eddy Simulations as a Design Tool for Gas Turbine Combustion Systems", AIAA Journal, vol. 44, No. 4, pp. 674-686, Apr. 2006.
Stephen Dooley et al., "A Jet Fuel Surrogate Formulated by Real Fuel Properties", Combustion and Flame, vol. 157, pp. 2333-2339 (2010).
P. Dagaut et al., "High Pressure Oxidation of Liquid Fuels from Low to High Temperature: 3.n-Decane", Combust. Sci. and Tech., vol. 103, pp. 233-349 (1994).
Saeed Jahangirian et al., "A Detailed Experimental and Kinetic Modeling Study of n-decane Oxidation at Elevated Pressures", Combustion and Flame, vol. 159, pp. 30-43 (2012).
S. Kirkpatrick et al., "Optimization by Simulated Annealing" Science , vol. 220, No. 4598, pp. 671-680, May 13, 1983.
L. Ingber, "Very Fast Simulated Re-Annealing", Mathl. Comput. Modelling , vol. 12, No. 8, pp. 967-973 (1989).
Frederick L. Dryer, "The Phrenology of Modeling Combustion Chemistry", Fossil Fuel Combustion: A Source Book, John Wiley & Sons, Inc., New York, NY, pp. 121-213, Copyright 1991.
Alexander Burcat, "Prof. Burcat's Thermodynamic Data", retrieved from http://garfield.chem.elte.hu/Burcat/burcat.html, dated Mar. 13, 2006 (4 pages).
Carmen M. Gracia-Salcedo et al., "Experimental Verification of the Thermodynamic Properties of a Jet-A fuel", NASA Technical Memorandum 101475, Technical Report 88-C-014, (1988) (10 pages).
Zhuyin Ren et al., "The invariant Constrained Equilibrium Edge Preimage Curve Method for the Dimension Reduction of Chemical Kinetics", The Journal of Chemical Physics, vol. 124, pp. 114111-1-114111-15 (2006).
Varun Hiremath et al., "A Greedy Algorithm for Species Selection in Dimension Reduction of Combustion Chemistry", Combustion Theory and Modelling, vol. 14, No. 5, pp. 619-652 (2010).

\* cited by examiner

FIGURE 11

COMPUTATIONALLY EFFICIENT REDUCED KINETICS METHODOLOGIES FOR JET FUELS

CROSS-REFERENCE TO RELATED APPLICATION

This application claims priority from U.S. Provisional Application No. 61/700,093 filed Sep. 12, 2012, the entirety of which is incorporated herein by reference.

INTRODUCTION

Maintaining stable combustion is a major challenge associated with the design and operation of gas turbines, which operate in different regimes due to the high temperature and large degree of vitiation of the air flow. These factors adversely affect the stability of the combustion process. Various approaches have been used to numerically simulate and predict combustion instabilities [1] and much effort has taken place to properly model the unsteady fluid mechanics around the flameholders [2]. However, accurate modeling of the combustion chemistry is of equal importance. A detailed surrogate chemical kinetics mechanism for jet fuel oxidation under vitiated and unvitiated conditions has been developed by the assignee of the application [3-5]. This mechanism operates in a hierarchical fashion where large hydrocarbon molecules break down into smaller olefins whose eventual oxidation is governed by CO and $H_2$ chemistry. The jet fuel surrogate kinetics model was developed to make accurate predictions for both low (<1000 K) and high temperature regimes over a range of pressures, as the inlet temperature in a typical combustion device varies over a wide range (700 K to 1500 K). Because of the complex nature of both combustion kinetics and jet fuels, the current surrogate kinetics model has 957 species and 2501 reactions, and is too large to implement in computational fluid dynamics (CFD) codes. Therefore, it is essential to have reduced chemical kinetics models that are computationally efficient for CFD implementation while also capable of predicting transient combustion phenomena such as ignition and extinction (also known as static stability limits) under gas turbine operating conditions.

DETAILED DESCRIPTION

There are several different approaches reported in the literature to develop reduced kinetics models from a detailed kinetics mechanism. The assignee of this application has demonstrated two different approaches for developing both quasi-global reduced kinetics models and skeletal models for propane using lumped-parameterization and sensitivity analysis, respectively. For example, the assignee of this application has developed a 14-species and 44-reaction quasi-global reduced kinetics model for propane and implemented it in LES with ISAT (in-Situ Adaptive Tabulation) to simulate the premixed flameholder experiments of Kiel et al. [7] to predict blow-out conditions [8]. It was found that the transported-PDF approach (referred to as Filtered Density Function (FDF) approach) was well suited for the blow-out predictions of highly unsteady bluff-body stabilized flames [8]. However, the use of FDF with multi-step complex chemistry for the simulation of practical devices at realistic conditions is still too computationally expensive for industrial applications. Therefore, the overall objective is to develop a modeling tool to improve the computational efficiency of CFD simulations that use finite-rate chemistry. This may be achieved by developing a software package to generate compact reduced kinetics models to reduce the computational time of the evaluation of turbulent-chemistry coupling.

A strategy may be used to develop modeling tools that help the CFD community at large to improve the computational efficiency and numerical accuracy of turbulent reactive flow simulations via an optimization software (rkmGen) for compact global reduced kinetics model generation by calibration against ignition delay time, laminar flame speed, and emissions data.

Figure 1:
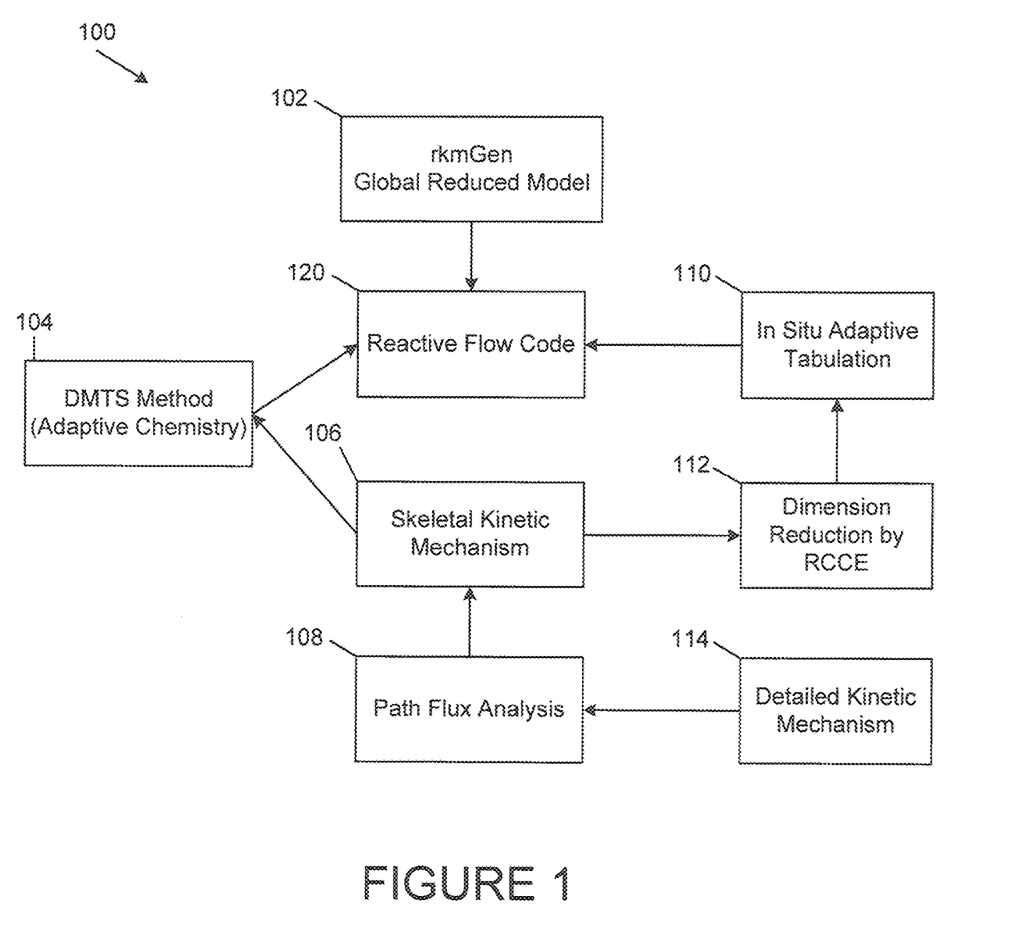
FIG. 1 illustrates a flowchart of the overall solution.

The flowchart shown in FIG. 1 illustrates a three-pronged strategy for developing computationally efficient methodologies for jet fuel reduced kinetics model development and implementation in CFD for reactive flow simulation. The illustrated strategy 100 includes a global reduced model (rkmGen) 102, DMTS method (adaptive chemistry [10] 104, skeletal kinetic mechanism 106, path flux analysis [12] 108, in situ adaptive tabulation [9] 110, dimension reduction by RCCE [11] 112, and a detailed kinetics mechanism 114. The result of the strategy 100 is reactive flow code 120. Computational efficiency and accuracy will be improved in all areas that are critical to modeling reacting flows: the finite rate kinetics mechanisms and the implementation of the kinetics into turbulent combustion CFD.

A lumped-parameterization based optimization scheme generates multi-step quasi-global reduced kinetics models by calibrating against laminar flame speed and ignition delay time. In this approach, one can generate compact reduced kinetics models (e.g., one-step, three-step, etc.) with varying numbers of species and reactions. This approach may be used to generate optimized reduced kinetics models that predict laminar flame speed data. This optimization scheme may be extended to perform simultaneous optimization for ignition delay time, laminar flame speed, and emissions (i.e., CO and NOX) to generate optimized reduced kinetics models. A stand-alone software package may be developed that can be used by CFD users from the power generation and propulsion communities.

A modeling tool that generates optimized reduced kinetics models for given operating conditions and a numerical scheme to speed-up kinetics evaluation of turbulent-chemistry coupling during CFD simulations is disclosed. This will be an important design tool for predicting ignition and flameholding phenomenon for most propulsion systems, including gas turbine applications. A lumped-parameterization based optimization scheme may generate multi-step quasi-global kinetics models using laminar flame speed as the target data. This scheme may be further extended to include optimization of emission predictions such as CO and $NO_x$. This extension of capabilities may be combined with an existing optimization scheme for ignition delay time to develop a software package, known as rkmGen, to perform simultaneous optimization for ignition delay time, laminar flame speed, and emissions. This may entail the generation of optimized global reduced kinetics models that satisfy major combustion properties of jet fuels. This may benefit the CFD community for gas turbines and other propulsion related design and analysis.

Figure 2:
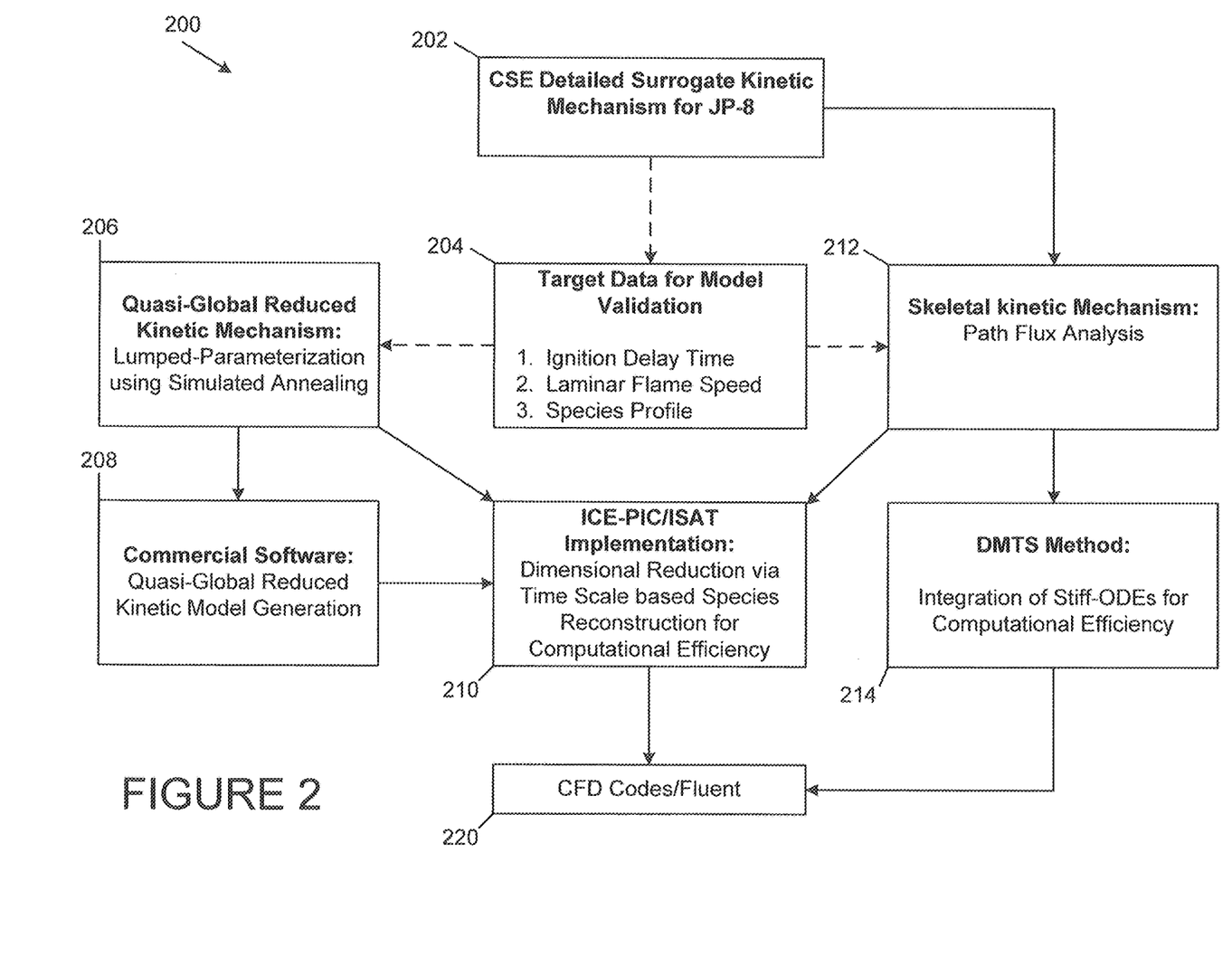
FIG. 2 illustrates a flowchart of the overall project describing the various tasks involved in accordance with an embodiment disclosed herein.

The flowchart shown in FIG. 2 illustrates an overall approach 200 that may be used for developing computationally efficient methodologies for reduced kinetics model development and its subsequent implementation in CFD for reactive flow simulations. The approach 200 includes a detailed surrogate kinetics mechanism for jet fuel 202, target data for model validation 203, lumped-parameterization using simulated annealing [18] (quasi-global reduced kinetics mechanism) 206, quasi-global reduced kinetics model generation software 208, dimensional reduction via multi-time scale based species reconstruction for computational efficiency (RCCE/ISAT [11] implementation) 210, path flux analysis [12] (skeletal kinetics mechanism) 212, and an integration of stiff-ODEs for computational efficiency (dynamic multi-time scale method [10]) 214. The result of the approach 200 can be coupled with CFD codes (FLUENT) 220.

Detailed Jet Fuel Surrogate Kinetics Model
The Assignee's Surrogate Kinetics Model Formulation The assignee's jet fuel model is a four-component surrogate kinetics mechanism that consists of the following four surrogate components:
n-Decane
iso-Octane
n-Propyl-Cyclohexane
n-Propyl-Benzene The model has been validated extensively against kinetics data over a wide range of conditions. In the earlier validation work [3-5], the surrogate composition for a given jet fuel was formulated in direct proportion to the class composition obtained from chemical analysis. However, in the current work, the surrogate mixture is formulated based on the recommendation of Dryer and co-workers [13], where the chemical composition of a four-component surrogate mixture is determined by matching three characteristics: the Derived Cetane Number (DCN), the hydrogen to carbon (H/C) ratio, and the Threshold Sooting Index (TSI).

Model Validation

Figure 3:
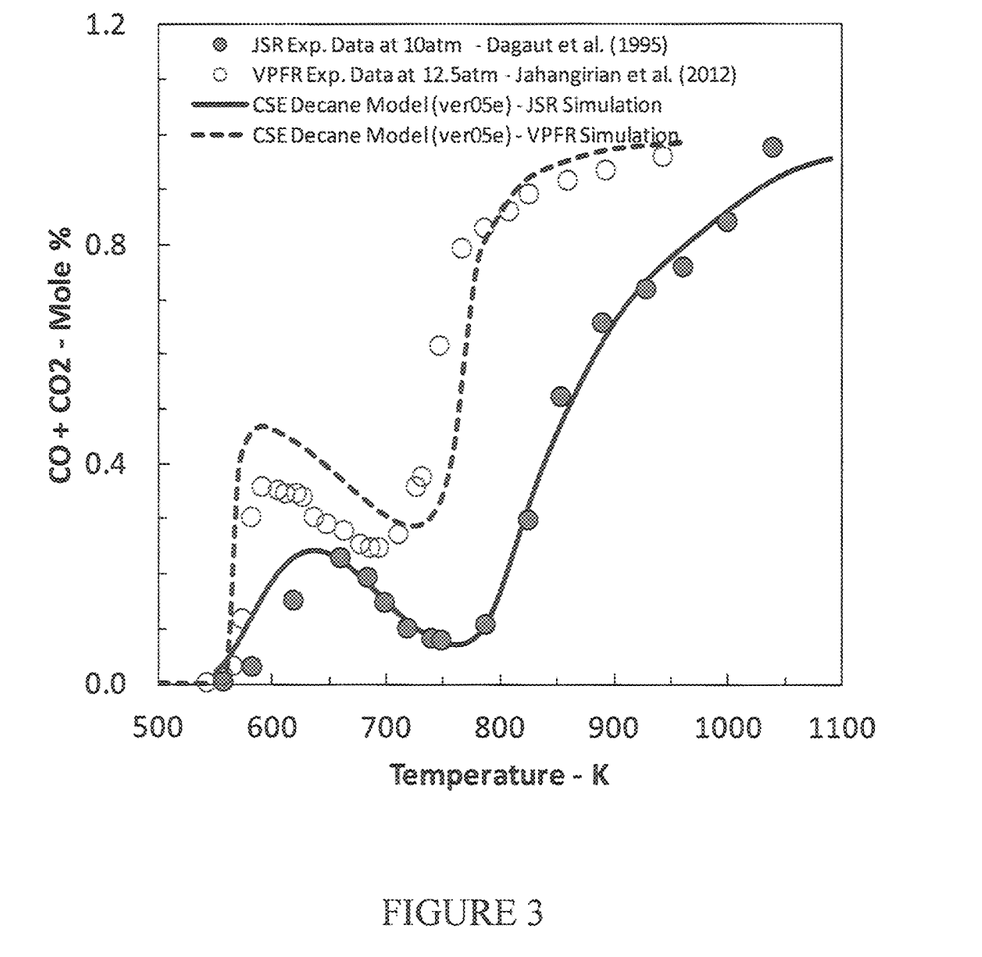
FIG. 3 illustrates comparison of disclosed model predictions of $CO+CO_2$ mole fractions to experimental data in JSR and VPFR.

The kinetics model for each surrogate component has been validated extensively against kinetics data over a wide range of conditions. Early validation results have been reported elsewhere [3-5]. A sample of the current refined model validation for n-decane reactivity is shown in FIG. 3. FIG. 3 shows comparison of the assignee's n-decane model predictions with the experimental data obtained in a Jet Stirred Reactor (JSR) [15] and a Variable Pressure Flow Reactor (VPFR) [16] at 10 atm and 12.5 atm pressures, respectively, using diluted fuel/oxidant mixtures. The predictions agree fairly well with the JSR experimental data but over-predict the CO+CO2 in VPFR simulation in the NTC region.

Model Prediction

Figure 4:
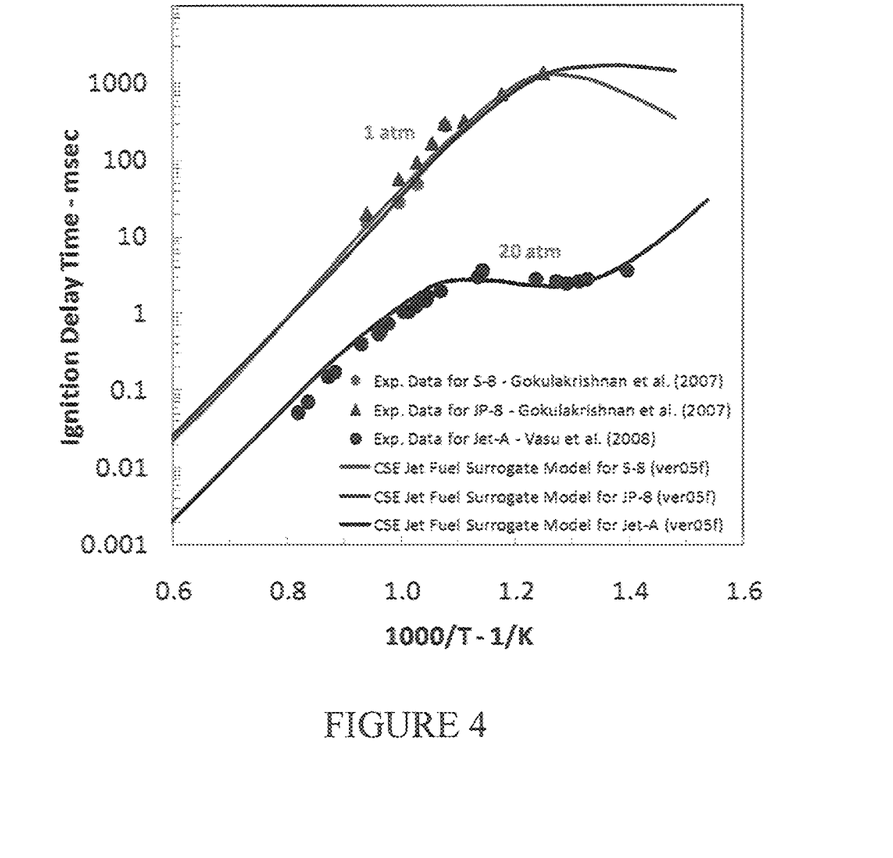
FIG. 4 illustrates model prediction and comparison of ignition delay time of jet fuel/air mixtures at 1 atm and 20 atm.

The improved detailed surrogate kinetics model for jet fuels has been used to predict autoignition time of jet fuel/air mixtures at both 1 atm and 20 atm. The comparison of the model predictions with the experimental data is shown in FIG. 4. Comparisons at atmospheric conditions were performed for jet fuels using data obtained from Gokulakrishnan et al. [4]. FIG. 4 also compares the ignition delay time predictions of the current surrogate model with shock tube experimental data for Jet-A at 20 atm. Overall, the surrogate models predict the ignition delay time data reasonably well at 1 atm and 20 atm.

Global Reduced Kinetics Model Development

The primary purpose of using a reduced mechanism is to save computational time and effort by eliminating the stiffness introduced by a detailed kinetics mechanism. Various types of global reduced kinetics models have been widely used in the industry for practical reactive flow simulations. However, very often, these reduced kinetics models are applicable to a very limited range of conditions. Therefore, an optimization scheme may be used to calibrate and optimize the global reduced kinetics models for a range of conditions using target data generated from a detailed kinetics model. An optimization scheme has been developed to calibrate the reduced kinetics models against laminar flame speed data.

For example, one-step global kinetics model for methane can be given by:

$$CH_4 + O_2 => CO_2 + 2H_2O \quad (R1)$$

The rate for the reaction is given by $$r = k[CH_4]^\alpha [O_2]\beta \quad (1)$$

The reaction rate constant, k1, is expressed by a modified-Arrhenius equation.

$$k = AT^n e^{-E/RT} \quad (2)$$

An optimization scheme has been developed for automatic generation of reduced kinetics models. This is done by estimating the reaction rate parameters, A, n and E in Equation (2), as well as $\alpha$ and $\beta$ in Equation (1) by calibrating against laminar flame speed data. A similar optimization scheme may also be used to calibrate a reduced kinetics mechanism with any number of species and reactions against ignition delay time data.

Optimization Algorithm and Software Development

A stochastic global optimization scheme known as the Simulated Annealing (SA) [14] has been used for parameter estimation of the rate coefficients in the reduced kinetics mechanism for a given condition. Simulated Annealing is analogous to the principal of statistical solid mechanics, where any system with a very large number of degrees of freedom can be cooled to a minimum energy level by a slow annealing process. Most deterministic optimization strategies find the nearest local optimum, and hence, they heavily depend on an initial guess to find the global optimum. In SA, at relatively high temperatures (one of the parameters of SA procedure), many solutions are accepted, even if they are bad. This allows the search to discover the gross features of the problem domain while avoiding local minimum. By gradually lowering the annealing temperature, SA ultimately yields a solution close to the global optimum. There are several different versions of SA techniques based on the type of "cooling schedule" and number of tuning parameters required to reach the optimum solution efficiently. The "cooling schedule" proposed by Ingber [15] has been implemented in the optimization scheme to reach the optimum solution efficiently.

Consider parameter $\psi$ in dimension i generated at annealing-time k with the range $$\psi_k^i \in [L^i, U^i] \quad (3)$$

where $L^i$ and $U^i$ are the lower and upper bounds of the parameters, respectively.

The new parameter at k+1 annealing-time is $$\psi_{k+1}^i = \psi_k^i + \lambda^i(U^i - L^i) \quad (4)$$

where random variable, $\lambda^i \in [-1,1]$ is obtained from the following distribution function, $$\lambda^i = \text{sign}(u^i - 0.5) \cdot T_i(k) \cdot \left\{ \left(1 + \frac{1}{T_i(k)}\right)^{abs(2u^i-1)} - 1 \right\} \quad (5)$$

where $u^i \in u[0,1]$.

The annealing temperature at annealing-time k is given by $$T(k) = T_0 e^{-c_i \cdot k^q} \quad (6)$$

where $T_0$ is initial annealing temperature and q is the quenching parameter of the system, and parameter ci is given by $$c_i = me^{-n \cdot q} \quad (7)$$

where m and n are two of the eleven (11) SA parameters that have to be tuned for a given problem to attain a good solution.

Figure 5:
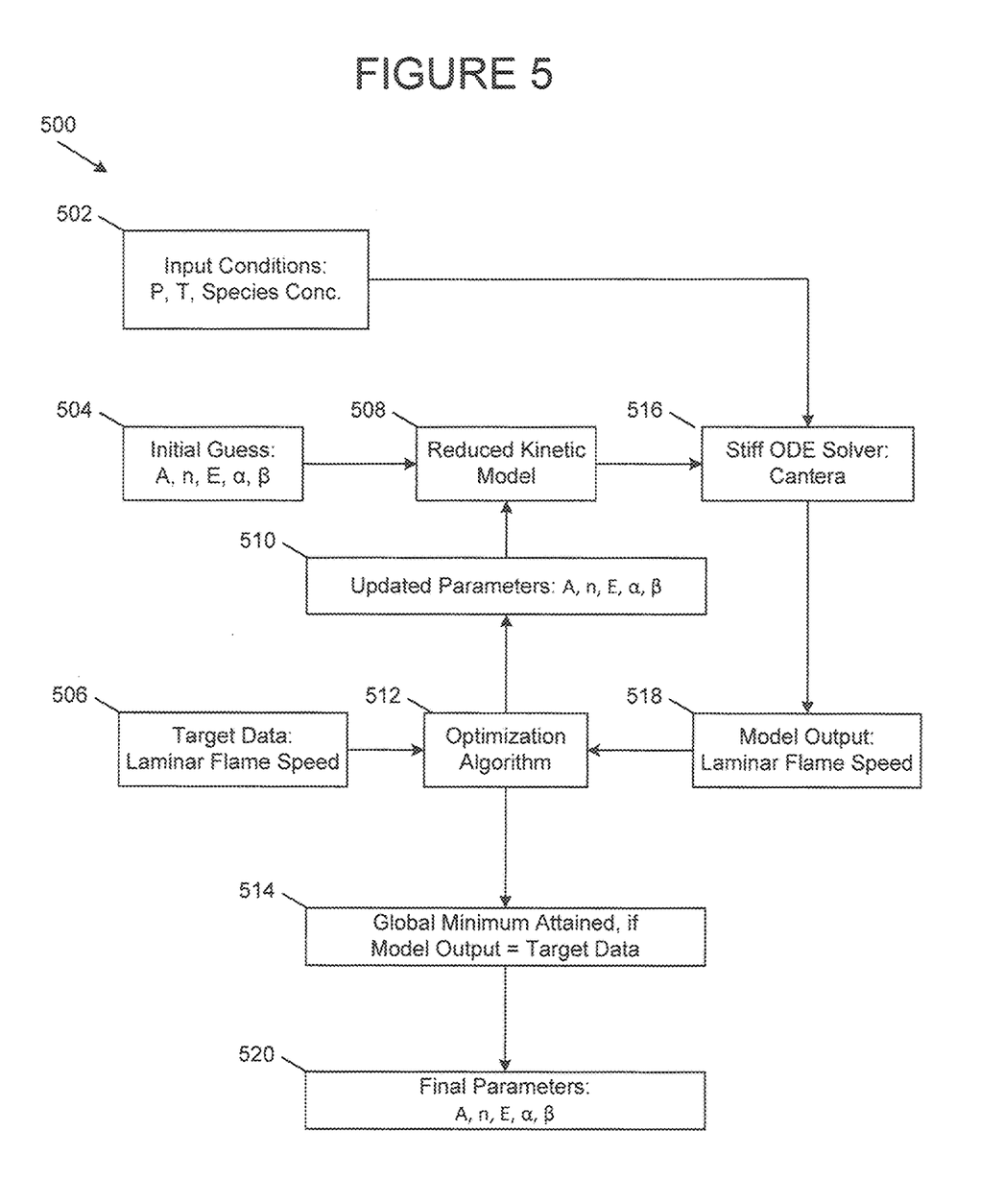
FIG. 5 illustrates a diagram of the optimization process disclosed herein.

FIG. 5 depicts the schematics of the optimization procedure 500 used for the parameter estimation. The illustrated procedure 500 includes input conditions 502, an initial guess 504, target data 506, a reduced kinetics model 508, updated parameters 510, an optimization algorithm 512, a global minimum 514, stiff ODE solver (Cantera) 516, model output 518, and final parameters 520. The SA optimization scheme coupled with Cantera may be used to optimize the reduced kinetics models against laminar flame speed data as shown in FIG. 5. The laminar flame speed data for a given condition is used as the target data to match the model output. Cantera [16], an object-oriented, kinetics simulation software may be coupled with SA for the computation of laminar flame speed for a given set of reaction rate parameters of the reduced model.

Three-Step Reduced Kinetics Model for Flame Speed

The optimization scheme may be used to generate a reduced kinetics model for jet fuel. The optimization method may be initially calibrated with methane/air mixtures and then used to optimize Jet-A/air flame speed calculations. The reduced kinetics mechanism consists of 3-steps and 5 species. The fuel decomposition reaction rate parameters for flame speed calculation may be estimated and optimized at 1 atm and 300 K using the ignition delay time data generated from detailed kinetics mechanisms (methane) and experimental data (Jet-A). The three reactions that are used for hydrocarbon reduction are:

$$C_m H_n + (m+n/4)O_2 = mCO + n/2 H_2O \quad (R2)$$

$$2CO + O_2 + 2H_2O = CO_2 + 2H_2O \quad (R3)$$

$$CO_2 = CO + O_2 \quad (R4)$$

The rate for the optimized reaction (R2) is given by:

$$r_1 = AT^n e^{\frac{-E}{RT}} [C_m H_n]^\alpha [O_2]^\beta \quad (8)$$

The rates for (R3) and (R4) are adapted from Dryer [17] and given by:

$$r_2 = 2.00 \times 10^{14} T^{0.0} e^{\frac{-40000}{RT}} [CO]^{1.0} [O_2]^{0.25} [H_2O]^{0.5} \quad (9)$$

$$r_3 = 5.00 \times 10^8 T^{0.0} e^{\frac{-40000}{RT}} [CO_2]^{1.0} \quad (10)$$

Figure 6:
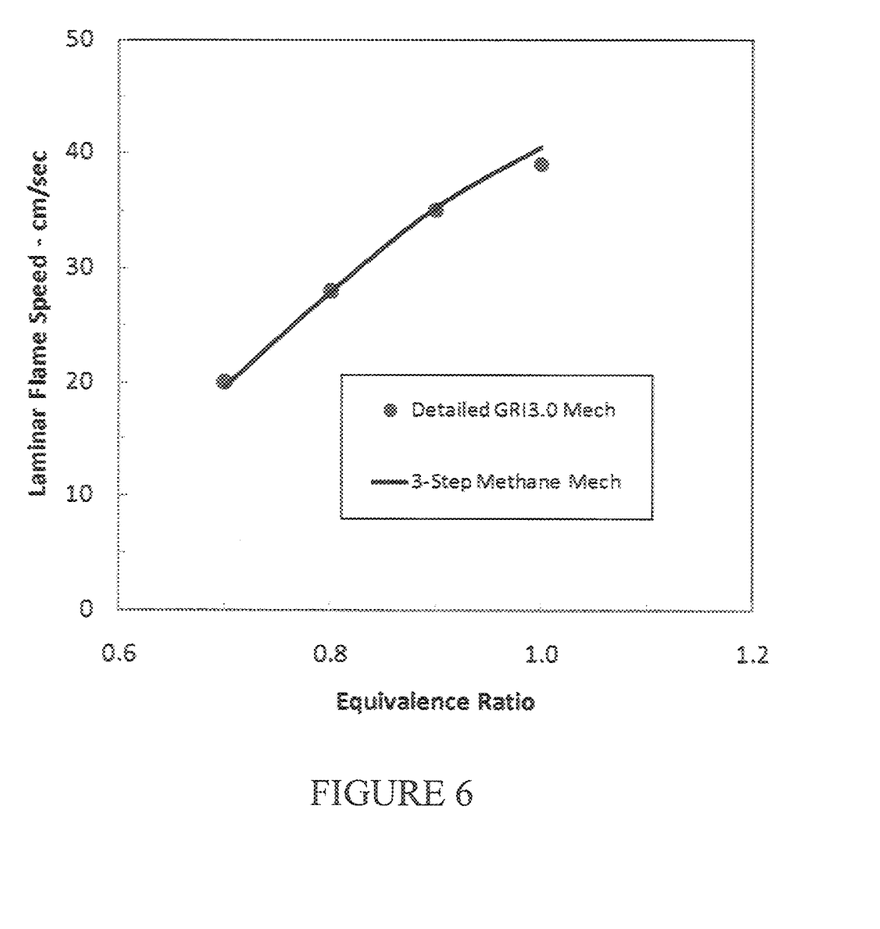
FIG. 6 illustrates 3-step kinetics model predictions of laminar flame speed compared with detailed model predictions for methane/air mixtures at 1 atm and 300 K.

The laminar flame speed optimization scheme may be performed with methane for calibration purposes. FIG. 6 compares the flame speed model predictions of the 3-step reduced kinetics model generated by the optimization scheme for lean to stoichiometric methane/air mixtures with the detailed kinetics mechanism (GRI 3.0) predictions. The optimization simulation software produced the following reaction rate parameters for reaction (R2) by optimizing over the 0.7 to 1.0 equivalence ratio range at 1 atm and 300 K.

The methane decomposition reaction laminar flame speed is given as:

$$r_1 = 1.424 \times 10^{10} T^{1.07472} e^{-\frac{39515}{RT}} [CH_4]^{0.96} [O_2]^{1.50} \quad (11)$$

where units of A are in cm-mol-K-sec and E are in cal/mol.

Figure 7:
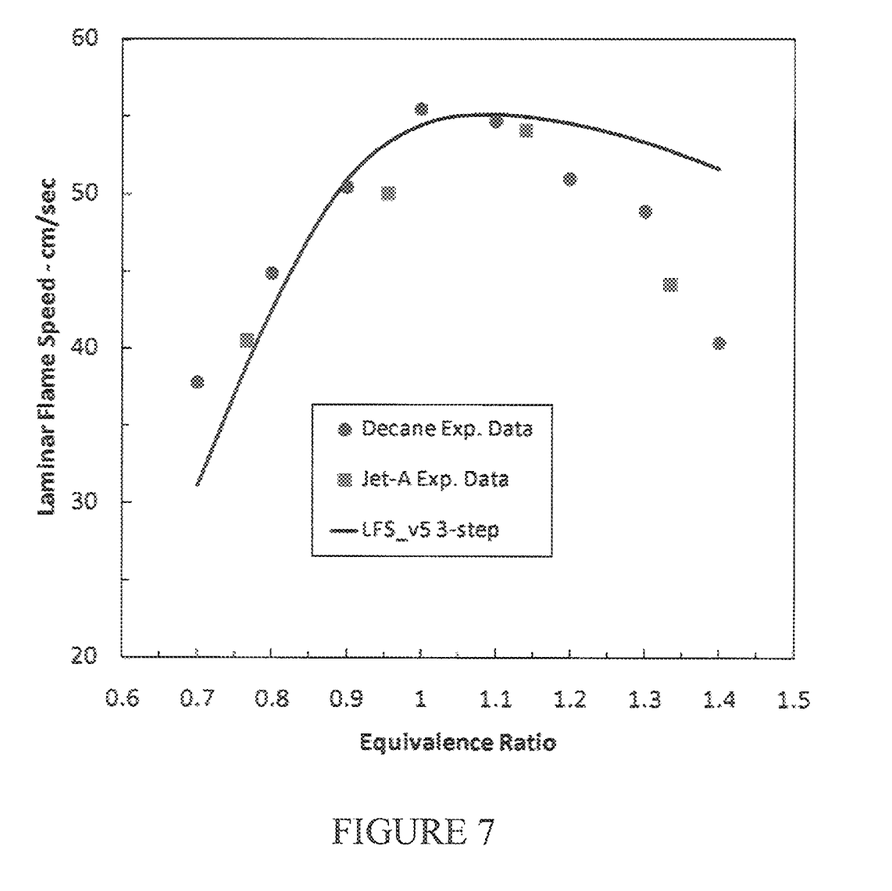
FIG. 7 illustrates 3-step kinetics model predications of laminar flame speed compared with experimental data for jet-A/air mixtures a 1 atm and 300 K.

Once the optimization scheme is calibrated, the laminar flame speed of lean to stoichiometric mixtures of Jet-A and air may be optimized. FIG. 7 compares the flame speed model predictions of the 3-step reduced kinetics model generated by the optimization scheme for lean to rich fuel/air mixtures with experimental data of n-decane and Jet-A. The optimization simulation software produced the following reaction rate parameters for reaction (R2) by optimizing over the 0.7 to 1.1 equivalence ratio range at 1 atm and 300 K. The fuel molecule for Jet-A was assumed to be $C_{12}H_{23}$. The composition and thermodynamic data for Jet-A were acquired from Burcat [18] and Gracia-Salcedo et al. [19] The fuel decomposition reaction for laminar flame speed is given as:

$$r_1 = 6.026 \times 10^{16} T^{2.0} e^{\frac{-38000}{RT}} [C_{12}H_{23}]^{0.96} [O_2]^{2.3} \quad (12)$$

where units of A are in cm-mol-K-sec and E are in cal/mol.

Three-Step Reduced Kinetics Model for Ignition Delay

The optimization scheme developed in an earlier study for ignition delay time optimization may be used to generate a reduced kinetics model for jet fuel. The reduced kinetics mechanism consists of 3-step and 5 species. The fuel decomposition reaction rate parameters were estimated and optimized over 0.1, 1 and 10 atm pressures using the ignition delay time data generated from the detailed surrogate kinetics mechanism for jet fuel. The fuel molecule for jet fuel was assumed to be $CH_{12}H_{23}$ and the fuel decomposition reaction is given as:

The ignition delay optimized reaction for jet fuel decomposition is:

$$r_1 = 7.516 \times 10^{17} T^{-1.0136} e^{-\frac{45636}{RT}} [C_{12}H_{23}]^{1.0031} [O_2]^{0.8319} \quad (13)$$

where units of A are in cm-mol-K-sec and E are in cal/mol.

Figure 8:
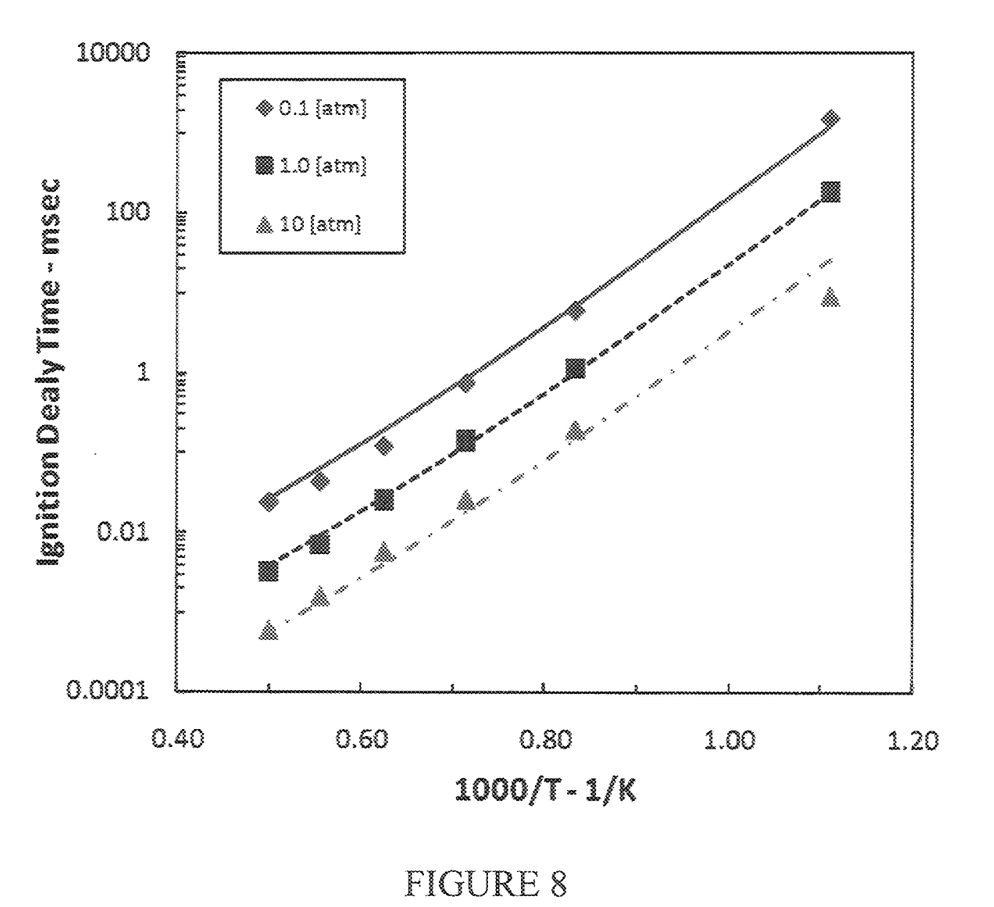
FIG. 8 illustrates reduced kinetics model predictions compared with detailed model predictions for stoichiometric jet fuel/air mixture.

FIG. 8 compares the ignition delay time model predictions of the 3-step reduced kinetics model for stoichiometric jet fuel/air mixture with a detailed surrogate kinetics mechanism at 0.1, 1 and 10 atm.

rkmGen Software Development

The optimization software package for the generation of global and quasi-global reduced kinetics models, known as rkmGen, currently consists of optimization schemes to calibrate against ignition delay time and laminar flame speed data. rkmGen capability may be further extended to include an optimization scheme for emissions (i.e. CO and NOx). In addition, rkmGen may be improved to perform the simultaneous optimization for ignition delay time, laminar flame speed, and emissions such that the reduced kinetic model will have improved fidelity for CFD applications.

Figure 9:
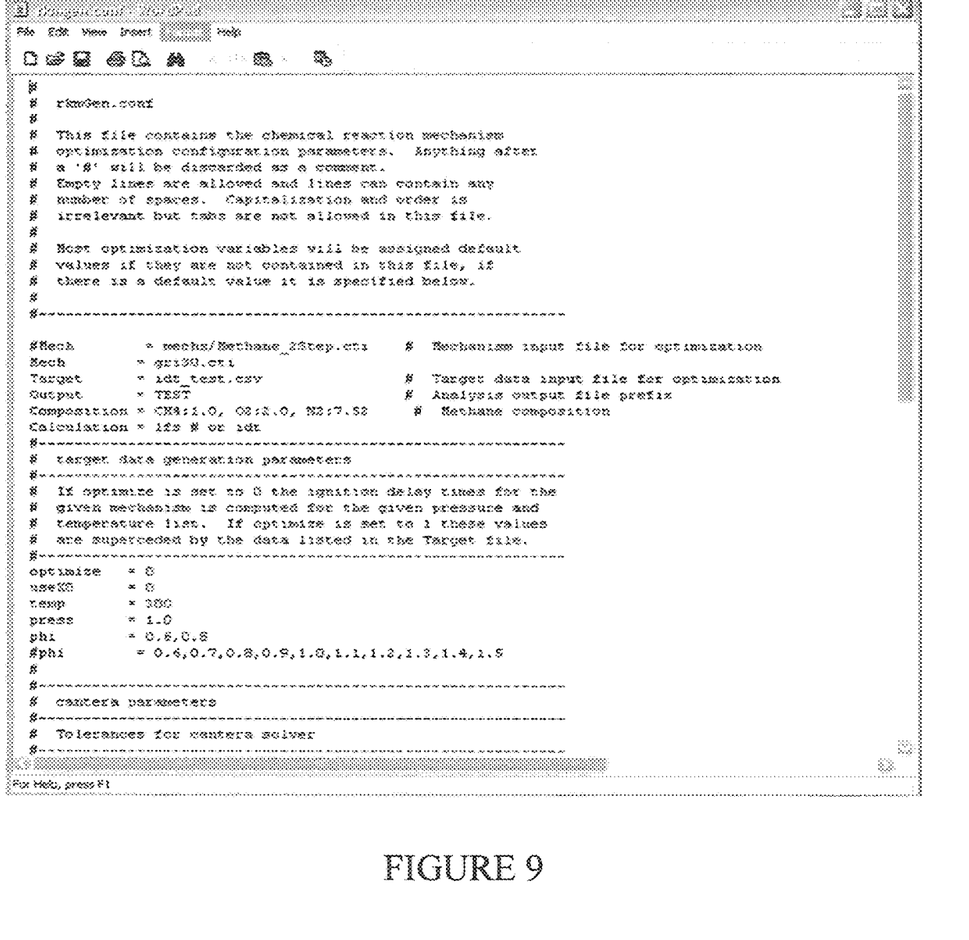
FIG. 9 illustrates an example input file for the rkmGen optimization software.
Figure 10:
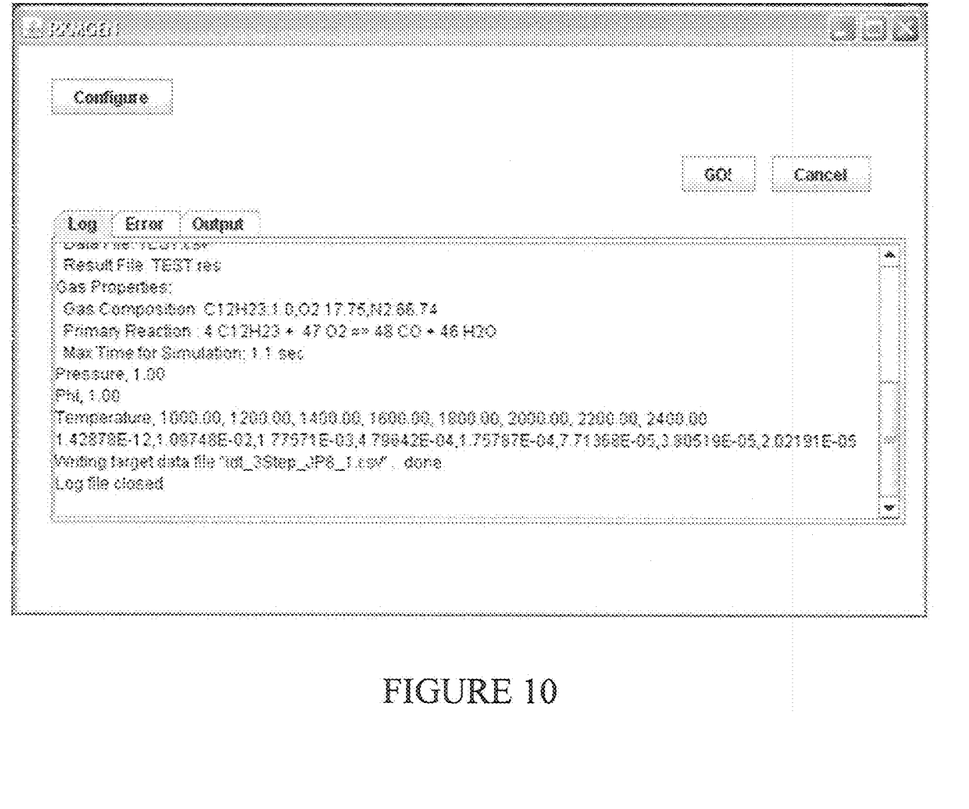
FIG. 10 illustrates an example output screen for the rkmGen optimization GUI.

The rkmGen software package consists of an optimization scheme in C++ coupled with Cantera. In the current work, a GUI (Graphical User Interface) was also developed in JAVA. Examples of the rkmGen input file and run-time GUI snap-shot are shown in FIG. 9 and FIG. 10 respectively.

An optimization scheme based on Simulated Annealing was developed and coupled with Cantera kinetics software to calibrate and optimize global kinetics models against laminar flame speed. This scheme was demonstrated to generate a three-step global kinetics model for jet fuel, using laminar flame speed data as the target. This C++ based optimization scheme will be coupled with an ignition delay time optimization scheme to develop a software package, known as rkmGen, to generate reduced kinetics models that will be optimized simultaneously against laminar flame speed, ignition delay time, and emissions (i.e., CO and $NO_x$).

Global Reduced Kinetics Model Optimization Using Emission Data

A typical jet fuel kinetics model consists of hundreds of species and thousands of reactions [3]. Therefore, it is a daunting task to reduce the detailed jet fuel kinetics models into tens of species that can reasonably be used in CFD simulations of practical propulsion systems such as gas turbines. To overcome this difficulty, an optimization scheme to calibrate global reduced kinetics models against target data generated from detailed kinetics models has been developed. This approach will allow the user to control the size of the reduced kinetics model (for example, it can be a one-step, three-step, etc.) so it will be suitable for the task and the computational resources available.

The assignee has developed a Simulated Annealing based optimization scheme to generate global reduced kinetics models for jet fuels by validating against laminar flame speed data. An optimization scheme generates global kinetics models for emission data such as CO and NOx by using flame species profiles as well as flow-reactor profiles as targets. FIG. 5 shows the flowchart of the algorithm that will be used for the optimization of the reduced kinetics model against emission data. The target data for emission calibration may be generated via:

(a) Coupling Simulated Annealing optimization scheme with steady-state laminar diffusion flame simulation scheme in Cantera such that the optimization of the global reduced kinetics model can be carried out against the target flame species profile generated by a detailed kinetics model.

(b) Coupling Simulated Annealing optimization scheme with PSR-PFR reactor configuration such that it will imitate a typical overall premixed combustor configuration to generate data for the global reduced kinetics model calibration using a detailed kinetics model.

(c) Coupling of ignition delay time, laminar flame speed, and emission data optimization schemes for optimized global reduced kinetics models.

The optimization schemes for laminar flame speed, ignition delay time and emissions will be coupled to develop an optimization scheme to generate global kinetics models by simultaneously optimizing against respective target data namely, laminar flame speed, ignition delay time and emissions. A series of tests will be performed to evaluate the numerical efficiency and accuracy when the scheme performs simultaneous optimization.

Stand Alone rkmGen Software Development for Multi-Objective Optimization

As the simultaneous optimization described above is computationally intensive, a stand-alone numerical solver may be developed using the SUNDIALS libraries. This enables the rkmGen software to be a marketable product independent of Cantera, which is currently used to solve for laminar flame speed, ignition delay time and emission data. In the current solver adapted from Cantera, the initial value ODEs are solved using CVODE [20] (i.e. to compute ignition delay time values), while the twopnt [21] scheme is used for two-point boundary value problem (i.e., computing laminar flame speed). Specially-tailored ODE/PDE solvers coupled with the Simulated Annealing optimization scheme will also reduce computational time of the rkmGen software as it can avoid other overhead processes associated with Cantera.

rkmGen Software Package Development

Figure 11:
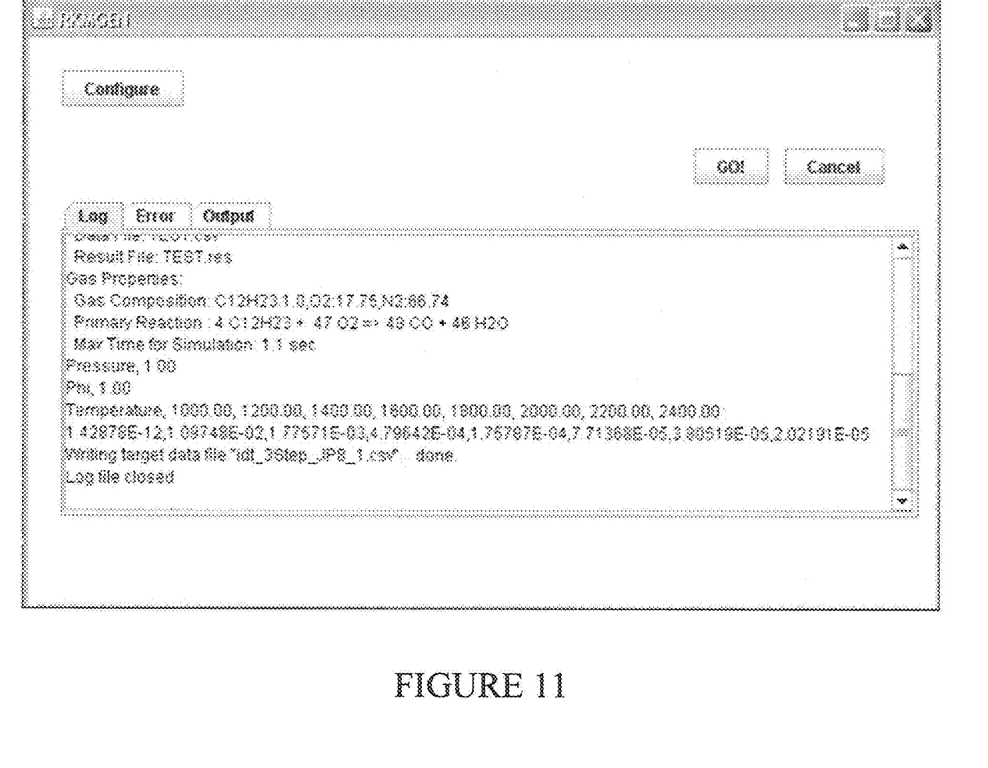
FIG. 11 illustrates an example output screen for the rkmGn optimization GUI.

A software package generates global reduced kinetic models for user defined conditions. The rkmGen software may be a collection of modules graphic user interface (GUI). A GUI front end for the rkmGen software may be developed. An example of the rkmGen run-time GUI snap-shot is shown in FIG. 11. This makes rkmGen user-friendly. The current GUI version implements a user interface for controlling and configuring the command line executable rkmGen. The rkmGen is designed to be run on Windows XP and all flavors of the Linux operating systems. The GUI is written in JAVA to aid in cross-platform development. One embodiment provides a simple word processing interface for configuring rkmGen, and it also provides execution controls as well as a tabbed window viewing of each of the important run files (i.e., error, log and info files). The capabilities and ease of use of the GUI may be expanded by providing dynamic graphical display of solution results and a more standard interface, two paths to this end. First, the desired features may be added to the current Java interface. Secondly, a more robust application framework will be explored. The package may be written using C++ and OpenGL to build on prior in-house software development and to provide the choice of a fully functional and dynamic menu driven command line interface (CLI) for power users or a GUI interface for more general use.

Environment

The techniques described above can be run on a computer system, which can include one or more computing devices or clusters of computing devices. The model can be used to model actual and/or proposed future combustors or other devices. The techniques disclosed herein can be used in connection with a computational fluid dynamics model to, for example, calculate a reacting flow field, which can be calculated for an actual device or a proposed device.

REFERENCES

1. Lovett, J. A., Brogan, T. P., Philippona, D. S., Keil, B. V. and Thompson, T. V. (2004), "Development Needs for Advanced Afterburner Designs", 40th AIAA/ASME/SAE/ASEE Joint Propulsion Conference and Exhibit, AIAA 2004-4192, Fort Lauderdale, FL.
2. Ebrahimi, H. B. (2006), "Overview of Gas Turbine Augmentor Design, Operation, and Combustion Oscillation", 42nd AIAA/ASME/SAE/ASEE Joint Propulsion Conference and Exhibit, AIAA 2006-4916, Sacramento, CA.
3. Gokulakrishnan, P., Gaines, G., Currano, J., Klassen, M. S. and Roby, R. J. (2006), "Experimental and Kinetic Modeling of Kerosene-Type Fuels at Gas Turbine Operating Conditions", *ASME Transactions: Journal of Engineering Gas Turbines and Power*, Vol. 129, pp. 655-663.
4. Gokulakrishnan, P., Gaines, G., Klassen, M. S., and Roby, R. J. (2007), "Autoignition of Aviation Fuels: Experimental and Modeling Study", $43^{rd}$ AIAA/ASME/SAE/ASEE Joint Propulsion Conference & Exhibit, AIAA 2007-5701, Cincinnati, OH.
5. Gokulakrishnan, P. Klassen, M. S. and Roby, R. J. (2008), "Ignition Characteristics of a Fischer-Tropsch Synthetic Jet Fuel", Turbo Expo 2008, GT2008-51211, Berlin, Germany.
6. Gokulakrishnan, P., Bikkani, R., Klassen, M. S., Roby, R. J., & Kiel, B. V. (2009). Influence of Turbulence-Chemistry Interaction in Blow-out Predictions of Bluff-Body Stabilized Flames. 47th AIAA Aerospace Sciences Meeting and Aerospace Exposition, AIAA 2009-1179,. Orlando, FL.
7. Kiel, B., Garwick, K., Gord, J. R., Miller, J., Lynch, A., Hill, R. and Phillips, S. (2007), "A Detailed Investigation of Bluff Body Stabilized Flames", 45th AIAA Aerospace Sciences Meeting and Exhibit, AIAA 2007-168, Reno, NV.
8. Gokulakrishnan, P., Foli, K., Klassen, M., Roby, R., Soteriou, M., Kiel, B and Sekar, B. (2009), "LES-PDF Modeling of Flame Instability and Blow-out in Bluff-Body Stabilized Flames", 45th AIAA/ASME/SAE/ASEE Joint Propulsion Conference & Exhibit, AIAA2009-5409, Denver, CO.
9. Pope, S (1997), "Computationally Efficient Implementation of Combustion Chemistry Using In Situ Adaptive Tabulation", *Combust. Theory Model.*, Vol. 1, pp. 41-63.
10. Gou, X., Sun, W., Chen, Z., and Ju, Y. (2010), "A Dynamic Multi-Timescale Method for Combustion Modeling with Detailed and Reduced Chemical Kinetic Mechanisms", *Combustion and Flame*, Vol. 157, pp. 1111-1121.
11. Tang, Q. and Pope, S. B. (2002), "Implementation of Combustion Chemistry In Situ Adaptive Chemistry Tabulation of Rate-Controlled-Constrained Equilibrium Manifolds", *Pro. Combus. Inst.*, Vol. 29, pp. 1411-1417.
12. Sun, W., Chen, Z., Gou, X. and Ju, Y. (2010), "A path flux analysis method for the reduction of detailed chemical kinetic mechanisms", *Comb. Flame*, Vol. 157, pp. 1298-1307.
13. James, S, Zhu, J, Anand, S, "Large-Eddy Simulations as a Design Tool for Gas Turbine Combustion Systems", AIAA Journal, Vol. 44, 2006, pp. 674-686.
14. Dooley, S., Won, S., Chaos, M., Heyne, J., Ju, Y., Dryer, F. L., Kumar, K., Sung, C., Wang, H., Oehlschlaeger, M. A., Santoro, R. J., and Litzinger, T. A. (2010), "A Jet Fuel Surrogate Formulated by Real Fuel Properties", Combust. Flame, in press.
15. Dagaut, P., Reuillon, M. and Cathonnet, M. (1994), "High Pressure Oxidation of Liquid Fuels from Low to High Temperature: 3. n-Decane, *Combust. Sci. and Tech.*, Vol. 103, pp. 233-349.
16. Jahangirian, S., Dooley, S., Haas, F. M. and Dryer, F. L. "A detailed experimental and kinetic modeling study of n-decane oxidation at elevated pressures", *Combustion and Flame*, Vol. 159, pp. 30-43.
17. Kirkpatrick, S., Gelatt, J. C., & Vecchi, M. P. (1983). Optimization by Simulated Annealing. *Science*, Vol. 220 (4598), 671-681.
18. Ingber, L. (1989). Very Fast Simulated Re-Annealing, *J. Math. Comp. Model.*, Vol. 12, pp. 967-973.
19. Goodwin, D. (n.d.). Retrieved 2008, from Cantera: http://www.cantera.org
20. Dryer, F. L. (1991), "The Phrenology of Modeling Combustion Chemistry" in *Fossil Fuel Combustion*, W. Bartok, & A. F. Sarofin (Eds.), John Wiley & Sons, Inc., New York, NY.
21. Burcat, A. (2006, March 13th). *Burcat's Thermodynamic Data*. Retrieved from Burcat's Thermodynamic Data: http://garfield.chem.elte.hu/Burcat/burcat.html
22. Gracia-Salcedo, C. M., McBride, B. J., Brabbs, T. A. (1988) Experimental verification of the thermodynamic properties of a Jet-A fuel. *Coal combustion and soot formation*, (pp. 875-882). Los Angeles, CA.

LIST OF ACRONYMS, ABBREVIATIONS, AND SYMBOLS

Company Names:
 CSE: Combustion Science and Engineering, Inc.
Computational Methods and Terms:
 CFD: Computational Fluid Dynamics
 LES: Large Eddy Simulation
 RCCE: Rate-Controlled Constrained Equilibrium
 ISAT: in-situ Adaptive Tabulation
 PDF: Probability Density Function
 FDF: Filtered Density Function
 PFA: Path Flux Analysis
 SA: Simulated Annealing
 DMTS: Dynamic Multi Time Scale
Kinetic Model Reactor Types:
 JSR: Jet Stirred Reactor
 PSR: Perfectly Stirred Reactor
 VPFR: Variable Pressure Flow Reactor
Fuel Properties:
 DCN: Derived Cetane Number
 H/C: Hydrogen to Carbon Ratio
 TSI: Threshold Sooting Index

What is claimed is:
1. A method for design and analysis of reacting flows for flameholders used in gas turbine engines by modeling at least one characteristic of fuel combustion or decomposition for a first fuel, said method comprising the steps of:
    generating, by a processor, a global reduced kinetics model of the at least one characteristic of fuel combustion or decomposition of the first fuel under a first set of operating conditions, wherein the global reduced kinetic model is expressed as a function of at least three reaction rate parameters, as well as reactant species concentrations of the first fuel raised to a power and the oxidizer raised to a different power; and optimizing the reaction rate parameters and reactant species' concentration powers of the global reduced kinetics model by a lumped-parameterization method comprising a simulated annealing process for estimating reaction rate parameters and reactant species' concentration powers of the reduced kinetics model based on at least laminar flame speed target data, the simulated annealing process implementing a cooling schedule to constrain a reaction rate parameter search used to estimate the reaction rate parameters of the reduced kinetics model, constraining the reaction rate parameter search between an upper and lower bounds using a factor specified by a user.

2. The method of claim 1, wherein the global reduced kinetics model is further optimized based on one or more of ignition delay time target data, or emission target data.

3. The method of claim 1, wherein the lumped-parameterization method optimizes ignition delay time, laminar flame speed or emission predictions.

4. The method of claim 1, further comprising the step of simulating the combustion of the first fuel using one or more reactive flow codes output from the optimized global reduced kinetics model.

5. The method of claim 1, further comprising performing, by the processor, dimension reduction to generate an adaptive tabulation of the at least one fuel characteristic for integration into reacting flow codes to control the design of the gas turbine engines.

6. The method of claim 1, wherein the first set of operating conditions include one or more of pressure, temperature or air-to-fuel mixture.

7. The method of claim 1, wherein the at least one characteristic comprises one or more of fuel chemistry or kinetics.

8. The method of claim 1, wherein the global reduced kinetics model comprises M number of species and M number of reactions and M is an integer between 1 and 10 inclusive.

9. A system for design and analysis of reacting flows for flameholders used in gas turbine engines by modeling at least one characteristic of fuel combustion or decomposition for a first fuel, said system comprising:

a processor programmed to:

generate a global reduced kinetics model of the at least one characteristic of fuel combustion or decomposition for the first fuel under a first set of operating conditions, the first set of operating conditions including one or more of pressure, temperature or air-to-fuel mixture, wherein the global reduced kinetic model is expressed as a function of at least three reaction rate parameters, as well as reactant species concentrations of the first fuel raised to a power and the oxidizer raised to a different power, optimize the reaction rate parameters and reactant species' concentration powers of the global reduced kinetics model using a lumped-parameterization method comprising a simulated annealing process for estimating reaction rate parameters and reactant species' concentration powers of the reduced kinetics model based on at least laminar flame speed target data, the simulated annealing process implementing a cooling schedule to constrain a reaction rate parameter search used to estimate the reaction rate parameters of the reduced kinetics model, constraining the reaction rate parameter search between an upper and lower bounds using a radius factor specified by a user.

10. The system of claim 9, wherein the global reduced kinetics model is further optimized based on one or more of ignition delay time target data or emission target data.

11. The system of claim 9, wherein the lumped-parameterization method optimizes ignition delay time, laminar flame speed or emission predictions.

12. The system of claim 9, wherein the processor is further programmed to perform dimension reduction to generate an adaptive tabulation of the at least one fuel characteristic for integration into reacting flow codes to control the design of the gas turbine engines.

13. The system of claim 9, wherein the at least one characteristic comprises one or more of fuel chemistry or kinetics.

14. The system of claim 9, wherein the global reduced kinetics model comprises M number of species and M number of reactions and M is an integer between 1 and 10 inclusive.

* * * * *